(12) United States Patent
Henley

(10) Patent No.: US 7,078,317 B2
(45) Date of Patent: Jul. 18, 2006

(54) METHOD AND SYSTEM FOR SOURCE SWITCHING AND IN-SITU PLASMA BONDING

(75) Inventor: Francois J. Henley, Aptos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

(21) Appl. No.: 10/913,630

(22) Filed: Aug. 6, 2004

(65) Prior Publication Data

US 2006/0030167 A1 Feb. 9, 2006

(51) Int. Cl.
*H01L 21/30* (2006.01)
(52) U.S. Cl. ............... 438/455; 438/456; 438/457; 438/458; 438/798
(58) Field of Classification Search ............... None
See application file for complete search history.

(56) References Cited

U.S. PATENT DOCUMENTS

| | | | | |
|---|---|---|---|---|
| 5,510,011 A | * | 4/1996 | Okamura et al. | 204/192.3 |
| 5,846,885 A | * | 12/1998 | Kamata et al. | 438/729 |
| 6,099,697 A | * | 8/2000 | Hausmann | 204/192.12 |
| 6,180,496 B1 | | 1/2001 | Farrens et al. | |
| 6,207,005 B1 | | 3/2001 | Henley et al. | |
| 6,335,535 B1 | * | 1/2002 | Miyake et al. | 250/492.21 |
| 6,534,381 B1 | | 3/2003 | Cheung et al. | |
| 6,645,828 B1 | | 11/2003 | Farrens et al. | |
| 6,780,759 B1 | * | 8/2004 | Farrens et al. | 438/635 |
| 6,815,366 B1 | * | 11/2004 | Higuchi | 438/714 |
| 6,875,366 B1 | * | 4/2005 | Sumiya et al. | 216/67 |
| 6,875,700 B1 | * | 4/2005 | Kanakasabapathy et al. | 438/710 |
| 6,899,766 B1 | * | 5/2005 | Miya et al. | 134/1 |
| 6,914,584 B1 | * | 7/2005 | Homma et al. | 345/63 |
| 2003/0003684 A1 | * | 1/2003 | Farrens et al. | 438/455 |
| 2004/0058552 A1 | * | 3/2004 | Higuchi | 438/710 |

* cited by examiner

*Primary Examiner*—David Nelms
*Assistant Examiner*—David Goodwin
(74) *Attorney, Agent, or Firm*—Townsend Townsend and Crew LLP

(57) ABSTRACT

A system for in-situ plasma treatment. The system has a processing chamber, e.g., plasma chamber. The system has a first susceptor coupled within the chamber and a second susceptor facing the first susceptor and being within the chamber. The system has one or more power sources. Preferably, a first power source is characterized by a first frequency. The first power source is coupled to the first susceptor and the second susceptor. A second power source is characterized by a second frequency. The second power source is coupled to the first susceptor and the second susceptor. A switching device is coupled to the first power source and is coupled the second power source. The switching device is configured to selectively apply the first frequency to the first susceptor while the second frequency is applied to the second susceptor and is alternatively configured to selectively apply the first frequency to the second susceptor while the second frequency is applied to the first susceptor.

21 Claims, 8 Drawing Sheets

METHOD AND SYSTEM FOR SOURCE SWITCHING AND IN-SITU PLASMA BONDING

BACKGROUND OF THE INVENTION

The present invention relates to the manufacture of substrates. More particularly, the invention provides a technique including a method and device for treating a first substrate to a second substrate for the manufacture of semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

Integrated circuits are fabricated on chips of semiconductor material. These integrated circuits often contain thousands, or even millions of transistors and other devices. In particular, it is desirable to put as many transistors as possible within a given area of semiconductor because more transistors typically provide greater functionality, and a smaller chip means more chips per wafer and lower costs.

Some integrated circuits are fabricated on a slice or wafer, of single-crystal (i.e., monocrystalline) silicon, commonly termed a "bulk" silicon wafer. Devices on such a "bulk" silicon wafer typically are isolated from each other. A variety of techniques have been proposed or used to isolate these devices from each other on the bulk silicon wafer, such as a local oxidation of silicon ("LOCOS") process, trench isolation, and others. These techniques, however, are not free from limitations. For example, conventional isolation techniques consume a considerable amount of valuable wafer surface area on the chip, and often generate a non-planar surface as an artifact of the isolation process. Either or both of these considerations generally limit the degree of integration achievable in a given chip. Additionally, trench isolation often requires a process of reactive ion etching, which is extremely time consuming and can be difficult to achieve accurately. Bulk silicon wafers, which are greater than 200 millimeters, are not free from defects and can reduce overall devices yields and the like.

An approach to achieving very-large scale integration ("VLSI") or ultra-large scale integration ("ULSI") uses epitaxial silicon wafers, which are commonly known as "epi-wafers." Epi-wafers often have a layer of high quality single crystalline silicon material defined overlying a face of a bulk substrate. The high quality silicon layer provides a good site for fabricating devices, often with higher yields, than conventional bulk silicon wafer materials. The high quality silicon material is often deposited by way of epitaxial silicon process reactors made by companies called Applied Materials, Inc. of Santa Clara, Calif. or ASM of Phoenix, Ariz.

Epitaxial wafers offer other advantages over bulk silicon technologies as well. For example, epitaxial wafers have almost perfect crystalline characteristics, which enhance device speed, functionality, and reliability. Additionally, the epitaxial wafers often provide higher device yields, than conventional bulk wafers. Many problems, however, than have already been solved regarding fabricating devices on bulk silicon wafers remain to be solved for fabricating devices on epitaxial silicon wafers. Epitaxial silicon wafers are made by way of epitaxial reactors, which are often expensive to purchase and difficult to maintain. The process of forming epitaxial silicon is also slow and time consuming. Accordingly, resulting epitaxial silicon wafers can often be expensive and cannot be used for the manufacture of many commercial or commodity devices such as dynamic random access memory devices (i.e., DRAMs), for example.

Another approach to achieving large scale integration often uses bonding substrates made of silicon bearing materials. Such bonding wafers are often made using layer transfer techniques and plasma activated bonding processes. An example of such a plasma activated process is described in U.S. Pat. No. 6,645,828, in the names of Farrens, et al., which issued Nov. 11, 2003, and is commonly assigned to Silicon Genesis Corporation of San Jose, Calif. The Farrens, et al. patent relates generally to in-situ plasma activated bonding techniques. These techniques have become important for the manufacture of bonding semiconductor substrates. Although Farrens, et al. has been effective, there may still be a need for improved bonding techniques.

From the above, it is seen that an improved technique for manufacturing a multi-layered wafer is highly desirable.

BRIEF SUMMARY OF THE INVENTION

According to the present invention, techniques for the manufacture of substrates are provided. More particularly, the invention provides a technique including a method and device for treating a first substrate to a second substrate for the manufacture of semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

In a specific embodiment, the present invention provides a method for in-situ plasma treatment of substrates, e.g., silicon wafers, silicon on insulator wafers. The method includes positioning a first face of a first substrate to a second face of a second substrate. The method maintains a predetermined gap (e.g., less than 3 cm, preferably in a range of about 1 mm to about 20 mm) between the first face and the second face. A major portion of the first face may be parallel to a major portion of the second face. The method initiates a plasma within the predetermined gap using a first bias characterized by a first frequency. Preferably, the first bias being applied to the first substrate while the second substrate is maintained at a first reference potential. The method maintains the plasma within a vicinity of the first face and the second face to initiate a plasma treatment on either or both the first face and the second face. The method also includes switching the first bias to the second substrate, while the first substrate is maintained at a second reference potential.

In another specific embodiment, the present invention provides a system for in-situ plasma treatment. The system has a processing chamber, e.g., plasma treatment chamber or plasma chamber. The system has a first susceptor within the chamber and a second susceptor facing the first susceptor and also being within the chamber. The system has one or more power sources. Preferably, a first power source is characterized by a first frequency. The first power source is coupled to the first susceptor and the second susceptor through a switching device. A second power source is characterized by a second frequency. The second power source is coupled to the first susceptor and the second susceptor through a switching device. The switching devices are coupled to the first power source and the second power source. The switching devices are configured to selectively apply the first frequency to the first susceptor while the second frequency is applied to the second susceptor and are alternatively configured to selectively apply the first frequency to the second susceptor while the second frequency is applied to the first susceptor.

In yet another specific embodiment, the present invention provides a technique for processing substrates using a novel cluster tool apparatus. The apparatus includes, among other elements, a transfer chamber comprising a robot therein. A plasma chamber is coupled to the transfer chamber, and a third chamber is coupled to the transfer chamber. The third chamber can be selected from at least a CVD chamber, an etch chamber, a PVD chamber, a thermal annealing chamber, a bonding chamber, a CCP (controlled cleavage process) chamber, a CMP (chemical mechanical polishing) chamber, a thermal treatment chamber, a plasma immersion ion implantation treatment chamber, an epitaxial growth chamber, and others. The present apparatus can process a plurality of substrates without breaking vacuum, which enhances process quality and device yields, among other factors. Alternatively, the substrates are processed at atmospheric conditions.

In another specific embodiment, the present invention provides an apparatus having a memory for processing substrates using a novel cluster tool apparatus. The memory has a computer program in the form of software, which can be in the form of computer codes or the like. The codes include one or more for operating a transfer chamber comprising a robot therein. The codes also include one or more for operating (e.g., turning on and off) a plasma treatment chamber that is coupled to the transfer chamber. A computer code also exists for operating a third chamber that is coupled to the transfer chamber. The third chamber can be selected from at least a CVD chamber, an etch chamber, a PVD chamber, a thermal annealing chamber, a bonding chamber, a CCP chamber, a CMP chamber, a thermal treatment chamber, a plasma immersion ion implantation treatment chamber, an epitaxial silicon (or other material) deposition chamber, and others. The present apparatus can process a plurality of substrates without breaking vacuum, which enhances process quality and device yields, among other factors. Alternatively, the substrates are processed at atmospheric conditions. The codes perform a variety of functions described herein as well as outside the present specification to manufacture substrates in the present clustertool apparatus.

Many benefits are achieved by way of the present invention over conventional techniques. For example, the present technique provides an easy to use process that relies upon conventional technology. In some embodiments, the method provides higher device yields and shorter processing time. Additionally, the method provides a process that is compatible with conventional process technology without substantial modifications to conventional equipment and processes. Preferably, the invention provides for an improved process integration for advanced integrated circuit devices. In an embodiment of the present invention, even activation is provided on a pair of wafers. Additionally, the present invention uses a novel plasma treatment technique which can occur in a chamber design without being exposed to ambient conditions, thereby preventing particulate contamination of the substrates, for example. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for the manufacture of substrates are provided. More particularly, the invention provides a technique including a method and device for treating a first substrate to a second substrate for the manufacture of semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

Figure 1:
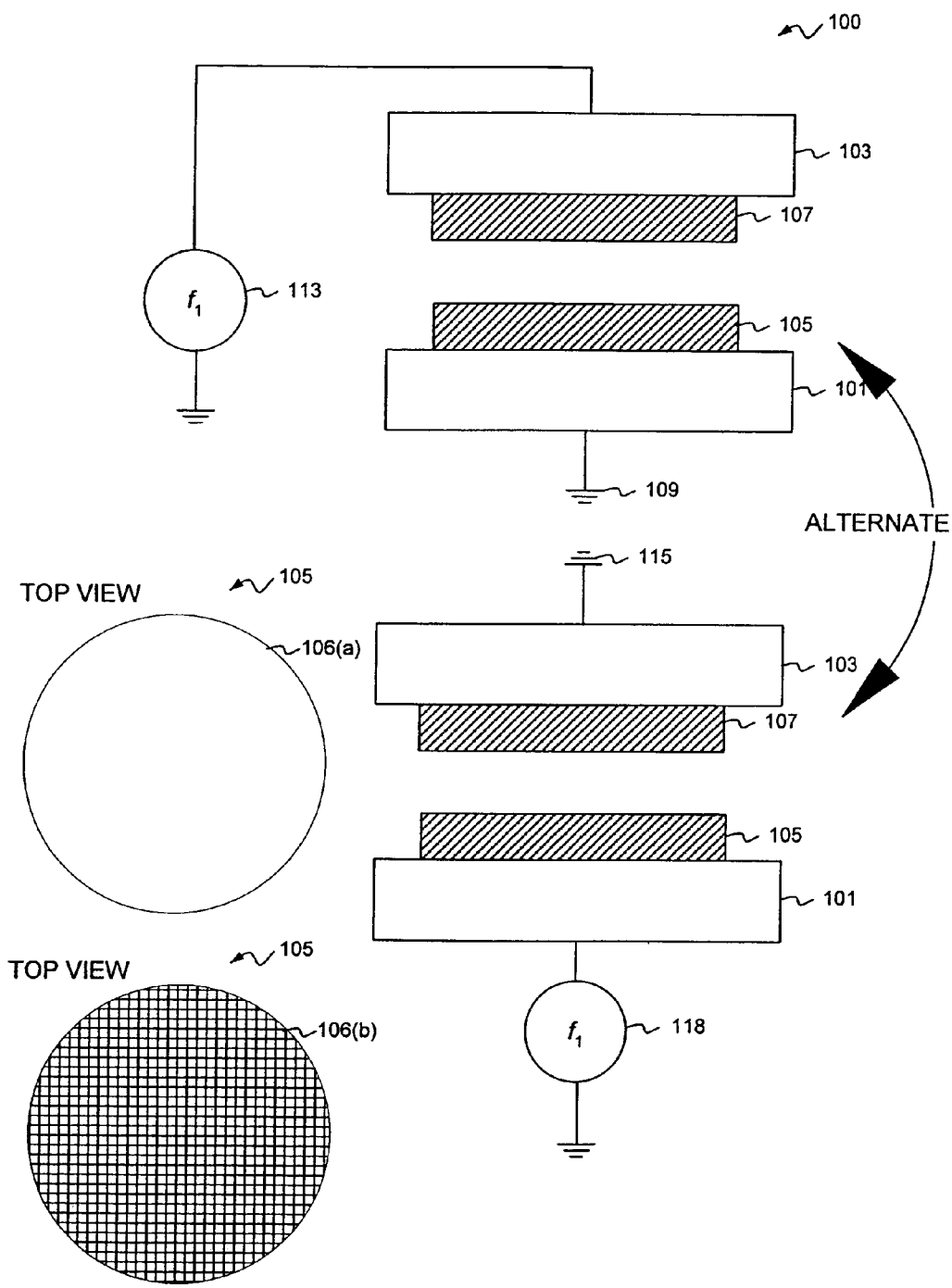
FIG. 1 is a simplified diagram of a treatment system according to an embodiment of the present invention.

FIG. 1 is a simplified diagram of a treatment system according to an embodiment of the present invention. This diagram is merely an example, which should not unduly limit the scope of the claims herein. One of ordinary skill in the art would recognize other variations, modifications, and alternatives. As shown, the present invention provides a system 100 for in-situ plasma treatment. The system 100 has a processing chamber, e.g., plasma chamber, atmospheric chamber. The processing chamber is often configured in a platform. The platform may be a clustertool or other like configuration. The chamber is made of a suitable material such as aluminum and/or anodized aluminum or the like.

Referring again to FIG. 1, the system 100 has a first susceptor 101 coupled within the chamber and a second susceptor 103 facing the first susceptor 101. Preferably, each of the susceptors maintains a respective substrate 105, 107. The substrate can be any material such as silicon, germanium, Group III/V materials, glass, and others. As shown, the second susceptor is also within the chamber. Faces of substrates 105, 107 can have patterns for a layout (such as face 106(*b*)) or, alternatively, can be blank (such as face 106(*a*)).

The system 100 has one or more power sources coupled to the susceptors. In a first state, a first power source 113 is coupled to susceptor 103, while susceptor 101 is coupled to a reference potential or a ground potential 109. In a second state, a second power source 118 is coupled to susceptor 101, while susceptor 103 is coupled to a reference potential or a ground potential 115. When treating substrates 105, 107, system 100 activates the one or more power sources in the first state and then switches to the second state. If desired, system 100 may repeatedly switch back and forth from the first and second states any number of times (e.g., 1, 2, 3, 10, 100, or more times). The duty cycle for first and second states of the one or more powers sources need not be 50% (i.e., duration of first and second state are the same). It can range from 0% (e.g., first state always on) to 100% (e.g., second state always on).

The first power source 113 and second power source 118 are both characterized by a first frequency. The first frequency is at least sufficient to maintain a plasma between the susceptors. In a specific embodiment, the first frequency is equal to or greater than a cyclotron frequency of ions of a gas being ignited. Depending upon the embodiment, the gas can include species of argon, oxygen, hydrogen, helium, nitrogen, combinations thereof, as well as air without water ($H_2O$) vapor. For example, if oxygen gas is used, the first frequency may be in the range of about 100 kHz to 1 MHz according to a specific embodiment.

Figure 2:
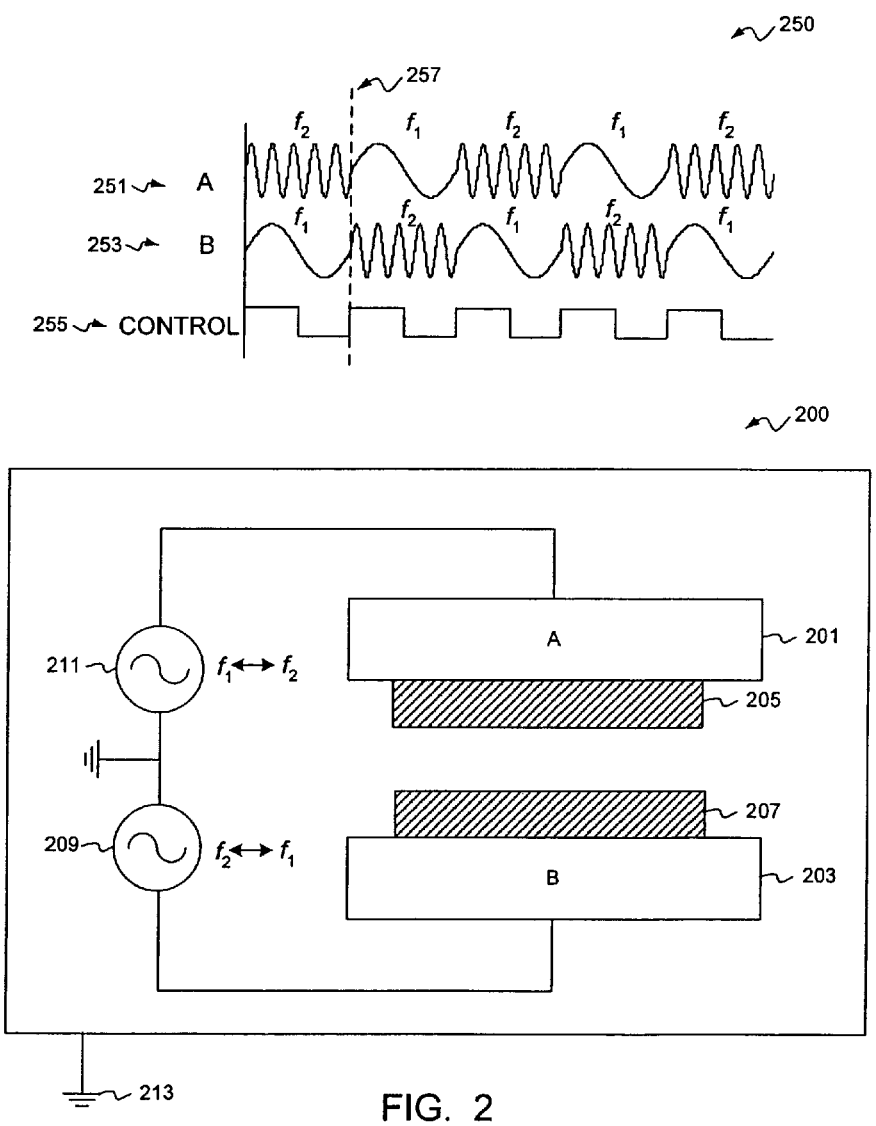
FIG. 2 is a simplified diagram of an alternative treatment system according to an embodiment of the present invention.

FIG. 2 is a simplified diagram of an alternative plasma treatment system according to an embodiment of the present invention. This diagram is merely an example, which should not unduly limit the scope of the claims herein. One of ordinary skill in the art would recognize other variations, modifications, and alternatives. As shown, the present invention provides a system 200 for in-situ plasma treatment. The system 200 has a processing chamber, e.g., plasma chamber, atmospheric chamber. The processing chamber is often configured in a platform. The platform may be a clustertool or other like configuration. The chamber is made of a suitable material such as aluminum and/or anodized aluminum or the like. The chamber is coupled to a reference potential 213, which may be ground or any other reference level.

Referring again to FIG. 2, the system has a first susceptor 201 coupled within the chamber and a second susceptor 203 facing the first susceptor 201. Preferably, each of the susceptors maintains a respective substrate 205, 207. The substrate can be any material such as silicon, germanium, Group III/V materials, glass, and others. As shown, the second susceptor 203 is also within the chamber.

The system 200 has one or more power sources coupled to the susceptors. A first power source 209 is coupled to the first susceptor 203. The first power source 209 is characterized by a first frequency (f1) and a second frequency (f2) in sequence 253. The second frequency, which is the higher frequency in this example, is sufficient to ignite and/or maintain a plasma (i.e., at least cyclotron frequency of a gas). The first frequency can be less than the cyclotron frequency of the gas or even zero (i.e., a DC signal). For example, the first and second frequencies can be 50 kHz and 400 kHz, respectively. Similarly, a second power source 211 is coupled to the second susceptor 201. The second power source 211 is characterized by the first frequency (f1) and the second frequency (f2) in sequence 251. In addition, the first and second frequencies can each have a sinusoidal, stepwise, square, ramp, or sawtooth waveform, as well as others. The waveforms for the first and second frequencies can be different from each other. As an embodiment of the present invention, signals (e.g., f1 and f2) generated by power sources can be in the range of about 10 volts to about 1000 volts, or larger. In alternative embodiment, the one or more power sources (e.g., first power source 209, second power source 211) can be characterized by a plurality of frequencies, such as three, four, five, or more frequencies.

Control signal 255 is used to control timing 250 of transitions between the first and second frequencies of sequences 251, 253. The period of the control signal 255 correlates to one cycle of the frequency transition (f1 to f2 and back to f1 for example). Solid state switches can be used to implement frequency transitions. As an embodiment of the present invention, frequency transitions can occur when the voltage levels applied to the substrates A and B are about the same, for example at time 257. This would reduce the possibility of switching transients since the switching event would occur when both sources cross a common reference potential.

Figure 3:
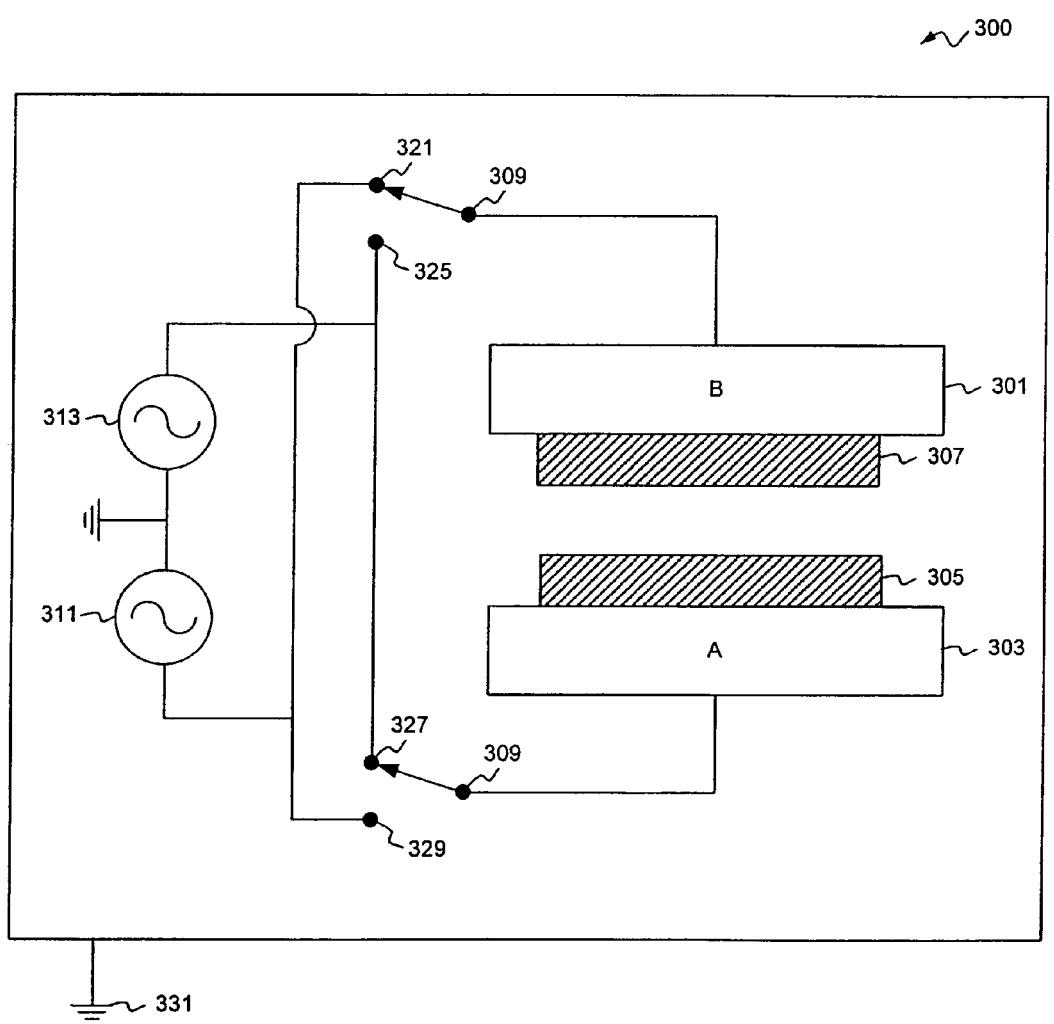
FIG. 3 is a simplified diagram of yet an alternative treatment system according to an embodiment of the present invention.

FIG. 3 is a simplified diagram of yet an alternative cleaning system according to an embodiment of the present invention. This diagram is merely an example, which should not unduly limit the scope of the claims herein. One of ordinary skill in the art would recognize other variations, modifications, and alternatives. As shown, the present invention provides a system 300 for in-situ plasma cleaning. The system 300 has a processing chamber, e.g., plasma chamber, atmospheric chamber. The processing chamber is often configured in a platform. The platform may be a clustertool or other like configuration. The chamber is made of a suitable material such as aluminum and/or anodized aluminum, or the like. The chamber is coupled to a reference potential 331, which may be ground or any other reference level.

Referring again to FIG. 3, the system has a first susceptor 301 coupled within the chamber and a second susceptor 303 facing the first susceptor 201. Preferably, each of the susceptors maintains a respective substrate 305, 307. The substrate can be any material such as silicon, germanium, Group III/V materials, glass, and others. As shown, the second susceptor 303 is also within the chamber.

The system 300 has one or more power sources coupled to the susceptors. A first power source 311 is characterized by a first frequency. The first power source 311 is coupled to the first susceptor 301 and the second susceptor 303 via switching device 309. A second power source 313 is characterized by a second frequency. The second power source 313 is coupled to the first susceptor 301 and the second susceptor 303 via switching device 309. The switching device 309 is coupled to the first power source 311 and is coupled the second power source 313. The switching device 309 is configured to selectively apply the first frequency to the first susceptor 301 while the second frequency is applied to the second susceptor 303 (i.e., switching device 309 coupled to nodes 321, 327) and is alternatively configured to selectively apply the first frequency to the second susceptor 303 while the second frequency is applied to the first susceptor 301 (i.e., switching device 309 coupled to nodes 325, 329). Switching device 309 can include solid state switches.

At least one of the first and second frequencies is sufficient to ignite and/or maintain a plasma (i.e., at least cyclotron frequency of a gas). The other frequency can be less than the cyclotron frequency of the gas or even zero (i.e., a DC signal). For example, the first and second frequencies can be 50 kHz and 400 kHz, respectively. The first and second frequencies can each have a sinusoidal, stepwise, square, ramp, or sawtooth waveform, as well as others. The waveforms for the first and second frequencies need not be the same.

Figure 4:
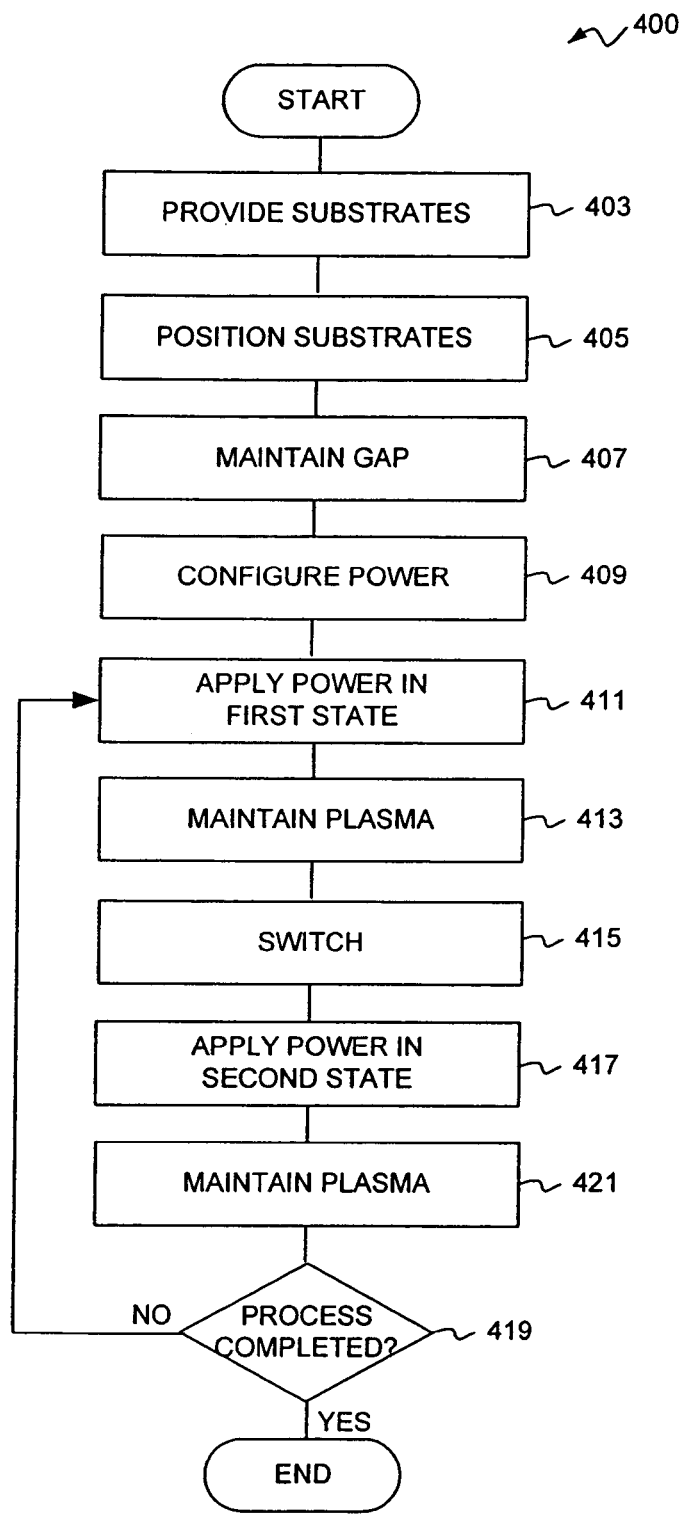
FIG. 4 is a simplified flow diagram of a treatment method according to an embodiment of the present invention.

FIG. 4 is a simplified flow diagram of a treatment method according to an embodiment of the present invention. This diagram is merely an example, which should not unduly limit the scope of the claims herein. One of ordinary skill in the art would recognize other variations, modifications, and alternatives. A treatment method 400 according to an embodiment of the present invention may be outlined as follows:

1. In step 403, provide a first substrate and a second substrate;
2. In step 405, face a first face of the first substrate to a second face of the second substrate;
3. In step 407, maintain a predetermined gap between the first face and the second face;
4. In step 409, configure power so that a first bias is characterized by a first frequency;
5. In step 411, initiate a plasma within the predetermined gap using a first bias characterized by a first frequency, the first bias being applied to the first substrate, while the second substrate is maintained at a lower reference potential (e.g., power in a first state);
6. In step 413, maintain the plasma within a vicinity of the first face and the second face to initiate a plasma treatment action on either or both the first face and the second face;
7. In step 415, switch the first bias characterized by the first frequency from the first substrate to the second substrate, and switch the lower reference potential from the second substrate to the first substrate (e.g., power in a second state);
8. In step 417, apply power in the second state, the first bias being applied to the second substrate, while the first substrate is maintained at the lower reference potential;
9. In step 419, maintain the plasma within a vicinity of the first face and the second face to initiate a plasma treatment action on either or both the first face and the second face;
10. In step 421, determine if the plasma treatment is completed and repeat steps 411 to 421 as desired; and
11. Perform other steps, as desired.

The above sequence of steps provides a method according to an embodiment of the present invention. As shown, the method uses a combination of steps including a way of plasma treating surfaces of substrates using a multi-frequency configuration for subsequently bonding these substrates together. Of course, other alternatives can also be provided where steps are added, one or more steps are removed, or one or more steps are provided in a different sequence without departing from the scope of the claims herein. For example, plasma treatment method 400 can be modified in the following ways:

(a) Adding a second bias characterized by a second frequency. The second bias can be applied to a substrate instead of the lower reference potential.
(b) The first bias (and any second bias) can be characterized by a plurality of frequencies.
(c) The first bias be continuously applied to the first substrate, while a second bias can be continuously applied to the second substrate. The first and second biases may each switch between a plurality of frequencies.

Further details of the present method can be found throughout the present specification.

Figure 5A:
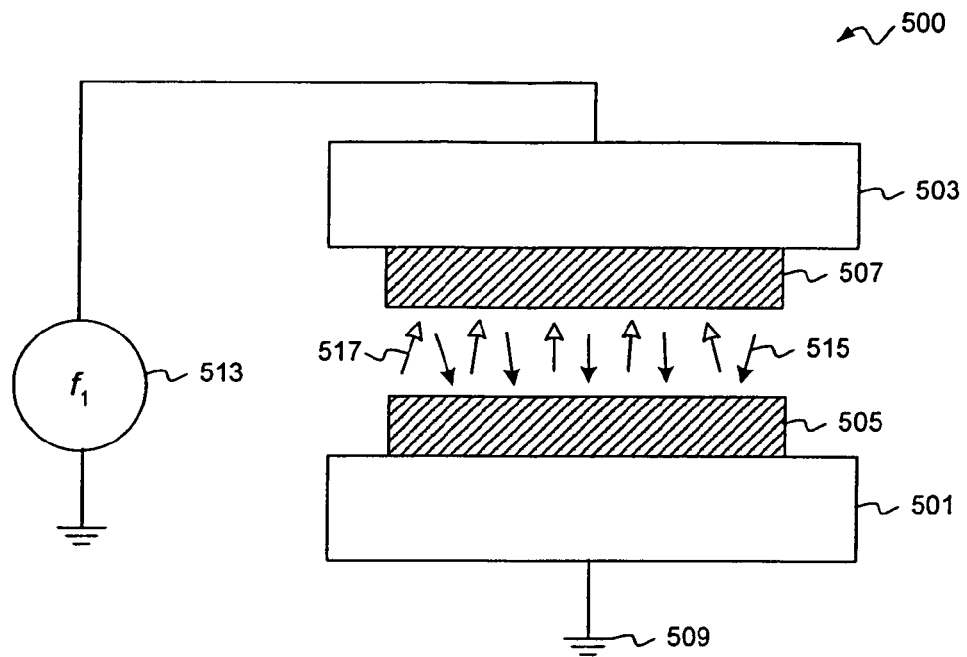
FIGS. 5A and 5B are a more detailed diagrams of a treatment method according to an embodiment of the present invention.
Figure 5B:
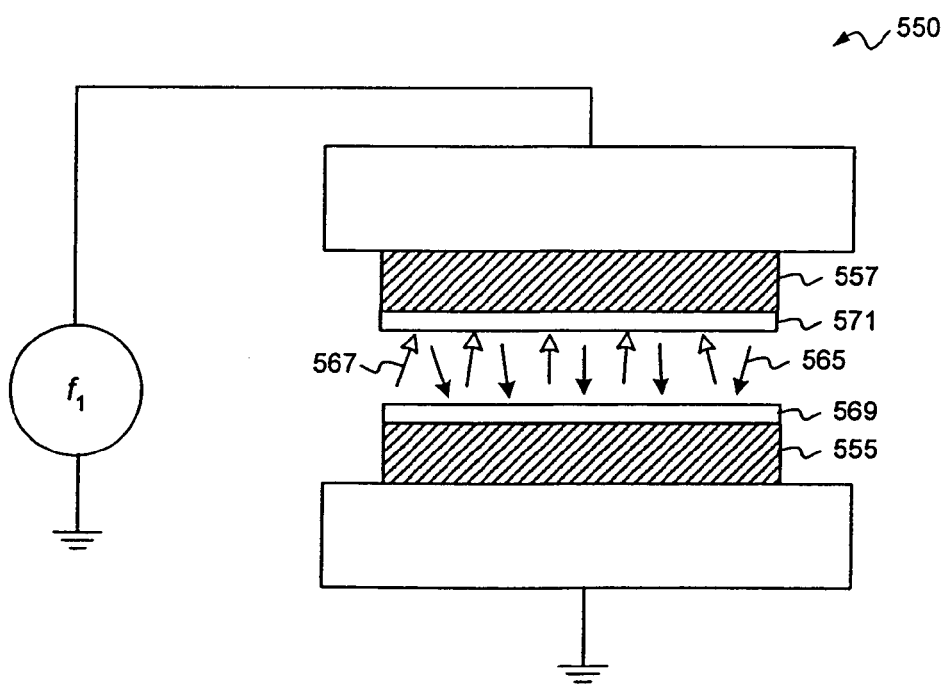

FIGS. 5A and 5B are more detailed diagrams of a treatment method according to an embodiment of the present invention. These diagrams are merely examples, which should not unduly limit the scope of the claims herein. One of ordinary skill in the art would recognize other variations, modifications, and alternatives. In system 500 of FIG. 5A, substrates 507, 505 are supported by susceptors 503, 501. Susceptor 503 is connected to a power source 513, while susceptor 501 is connected to a reference potential 509. Power source 513 applies a first frequency to susceptor 503 to initiate and maintain a plasma between substrate 507 and substrate 505, whereby ions 515 impinge upon substrate 505 to form dangling bonds and electrons 517 impinge upon substrate 507. As a result, surface conditions of substrate 505 is suitable for in-situ bonding. Referring to FIG. 5B, substrates 555, 557 can include film layers 571, 569, such as layers of silicon oxide ($SiO_2$). Ions 565 impinge upon film layer 569 and electrons 567 to film layer 571 due to a plasma between the substrates. This results in a surface on film layer 569 suitable for in-situ bonding. If the plasma treatment requires an asymmetrical biasing, switching the bias sources would balance the plasma treatment action on both substrates 505 and 507 to optimize bonding of both substrates. The bonding action could be performed in-situ by having a substrate joining mechanism with the plasma chamber or ex-situ where both substrates are now ready for subsequent bonding operations.

Figure 6:
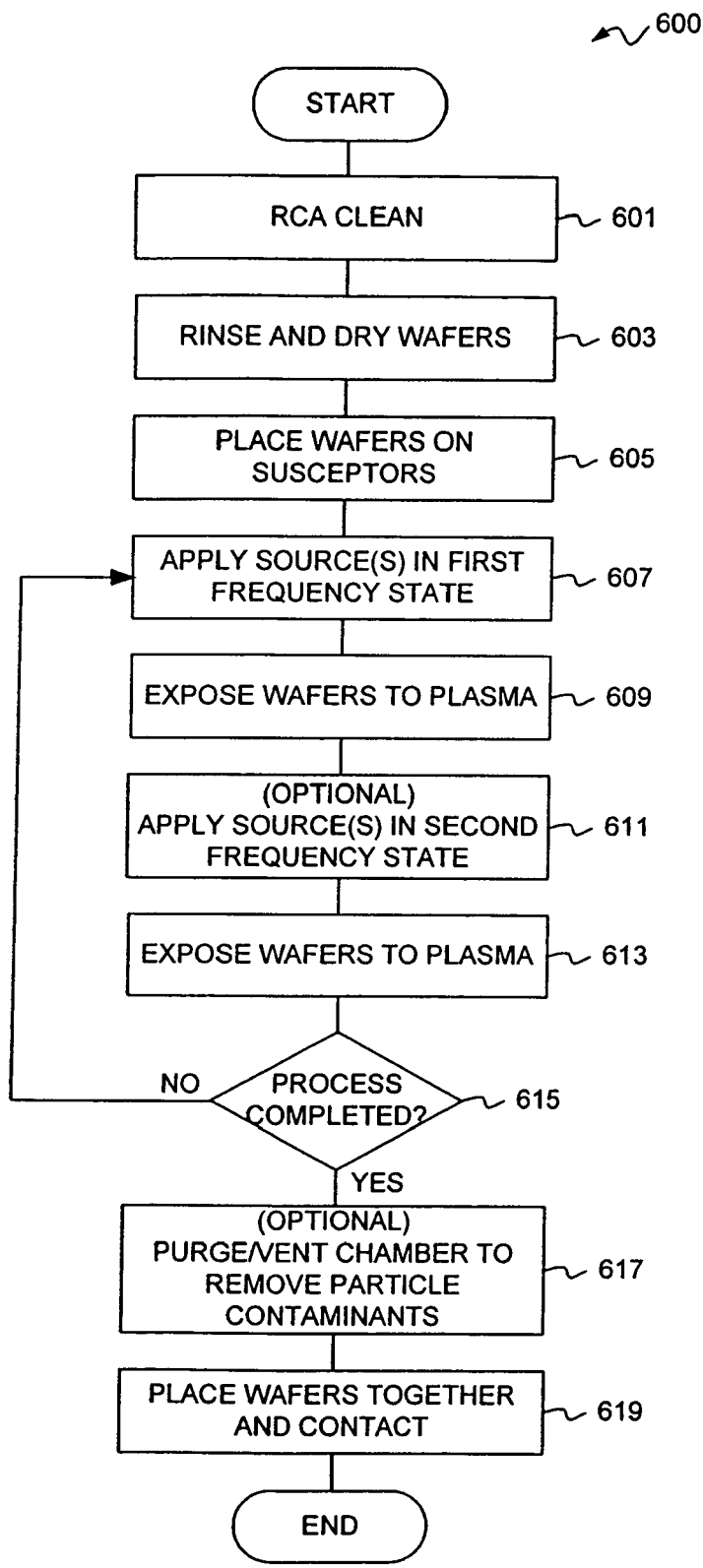
FIG. 6 is a simplified flow diagram of a bonding method according to an embodiment of the present invention.

FIG. 6 is a simplified flow diagram of a bonding method according to an embodiment of the present invention. This diagram is merely an example, which should not unduly limit the scope of the claims herein. One of ordinary skill in the art would recognize other variations, modifications, and alternatives, and further will appreciate that the method of this embodiment can be modified to suit a variety of applications depending on the material used and the interface desired. Of course, other alternatives can also be provided where steps are added, one or more steps are removed, or one or more steps are provided in a different sequence without departing from the scope of the claims herein.

The method 600 of the present invention generally comprises the following steps.

(a) For silicon dioxide, silicon, silicon nitride or other materials where an insulating interface is desired, an oxygen, nitrogen, or argon plasma can be used effectively according to the following steps:
1. RCA clean, in step 601, the wafers omitting the HF dip for oxide surfaces;
2. Rinse the wafers and dry, in step 603. Drying can be carried out using spin-rinse-drier, dry nitrogen, or other conventional state of the art drying technique;
3. Place the wafers into a processing chamber in step 605;
4. Apply a first frequency state of one or more power sources to susceptor(s) and initiate plasma in step 607;
5. Expose wafers to plasma in step 609;
6. (Optional) Apply a second frequency state of one or more power sources to susceptor(s) in step 611;
7. Expose wafers to plasma in step 613;
8. Determine if process completed in step 615 and repeat plasma bias states as required by repeating steps 607 to 613;
9. (Optional) Purge/vent chamber atmosphere in step 617; and
10. Without breaking vacuum or at atmospheric pressure, place the wafer surfaces together and contact. Bonding will occur in step 619.

(b) For silicon, gallium arsenide, indium phosphide, or other materials where a direct contact without an interface is desired, hydrogen, argon with hydrogen (forming gas), or H/He plasma can be used effectively according to the following steps:

1. For silicon, RCA clean, in step 601, the wafers utilizing a HF dip or using another conventional state of the art cleaning method;
2. (Optional) Rinse the wafers and dry in step 603. Drying can be carried out using spin-rinse-drier, dry nitrogen, or other conventional state of the art drying technique;
3. Place the wafers into a processing chamber in step 605;
4. Apply a first frequency state of the one or more power sources to susceptor(s) in step 607;
5. Expose the wafers to plasma of the desired gas in step 609;
6. (Optional) Apply a second frequency state of the one or more power sources in to susceptor(s) in step 611;
7. Expose wafers to plasma in step 613;
8. Determine if process completed in step 615 and repeat plasma bias states as required by repeating steps 607 to 613;
9. (Optional) Purge/vent chamber atmosphere in step 617; and
10. Without breaking vacuum, place the wafer surfaces together and contact. Bonding will occur in step 615.

In-situ, plasma wafer bonding can be modified in several ways, including the following:

(a) Changing plasmas, Ar, N, $O_2$, $H_2$, He, etc. A feature is using a plasma which reduces the surface species of the candidate material.
(b) Altering exposure times. Care must be taken to limit the exposure time to a minimum such that surface roughening does not occur as well at to prohibit excessively thick interfaces. Surface charge reaches a maximum with less than 30 to 120 seconds exposure time.
(c) Altering the power and flow rate of the plasma gasses. Care must be taken to limit surface roughening, damage, charging, and contamination.
(d) Location of the wafers in the plasma.

Figure 7:
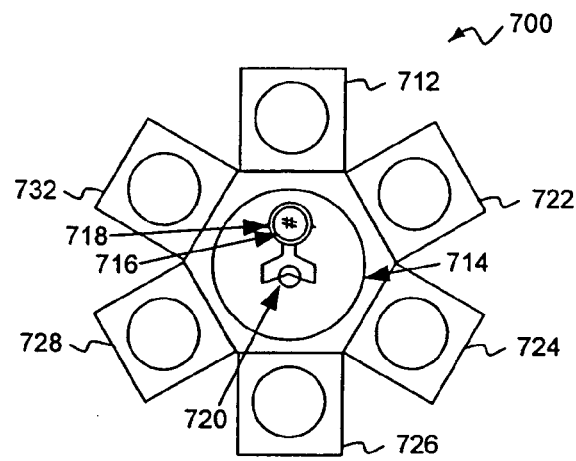
FIGS. 7–9 are simplified diagrams illustrating an apparatus for plasma treatment according to an embodiment of the present invention.

FIG. 7 is a simplified diagram illustrating an apparatus using source switching for plasma treatment, according to an embodiment of the present invention. This diagram is merely an example, which should not unduly limit the scope of the claims herein. One of ordinary skill in the art would recognize other variations, modifications, and alternatives. In FIG. 7, a cluster tool 700 is configured in a circular or round annular configuration. That is, transfer chamber 714, including a robot 720, is placed in a center region, which is surrounded by a plurality of chambers, shown by at least reference numerals 712, 722, 724, 726, 728, and 732. Accordingly, robot 720 can insert and remove a wafer 716 or wafers from any one of the chambers according to a desired application. Robot 720 includes a wafer handler 718, which holds the wafer 716.

Depending upon the application, the chambers are selected for the particular process recipe. More particular, the present cluster tool uses a novel arrangement of chambers including a plasma immersion implantation (PIII) chamber 712, a controlled cleaving process chamber 722, a plasma treatment chamber 724, and a bonding chamber 726, which can be used in combination to form, for example, an SOI wafer, as well as other substrates and integrated circuits. Cluster tool 700 also includes an input/output chamber 728, which is used for loading an in-process wafer, and unloading a processed wafer. Additional chamber 732 can perform a variety of other processes such as thermal treatment, chemical vapor deposition ("CVD"), physical vapor deposition ("PVD"), plasma or reactive ion etching, and others. Of course, the exact configuration of chambers used in the present cluster tool apparatus depends upon the application.

Figure 8:
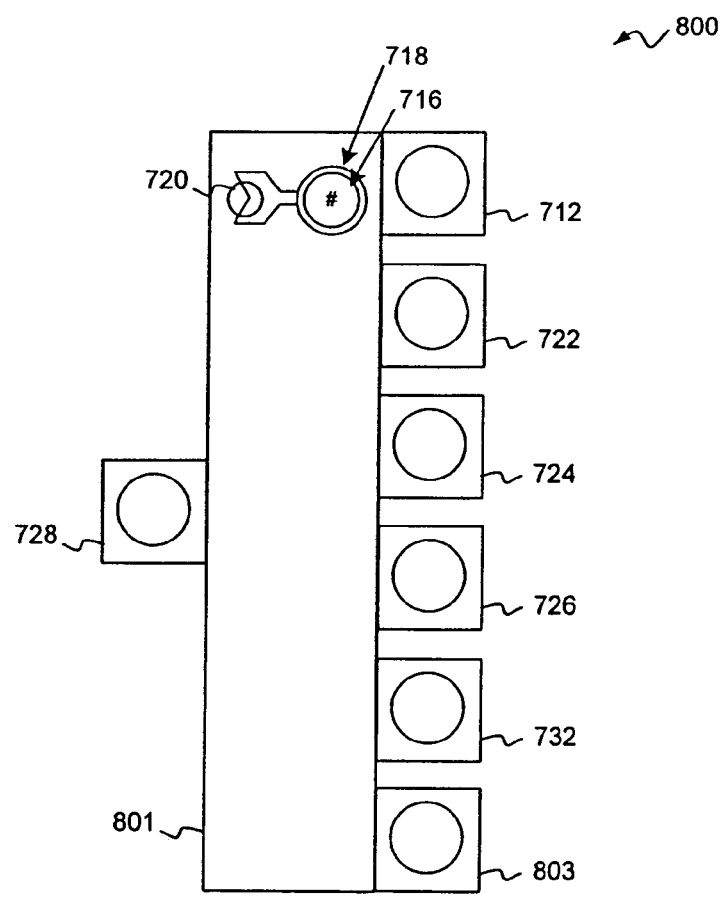

FIG. 8 is a simplified diagram of a cluster tool 800 using source switching for in-situ bonding according to an alternative embodiment of the present invention. This diagram is merely an illustration and should not limit the scope of the claims herein. One of ordinary skill in the art would recognize other variations, modifications, and alternatives. For cross-referencing purposes, some of the reference numerals in FIG. 7 are similar to those shown in FIG. 8. The cluster tool 800 is configured in an in-line or linear configuration. That is, transfer chamber 801, including a robot 720, is placed in parallel alignment with a plurality of chambers, shown by reference numerals 712, 722, 724, 726, 728, 732, and 803. Accordingly, robot 720 can insert and remove a wafer 716 or wafers, which rests on handler 718, from any one of the chambers according to the desired application.

Depending upon the application, the chambers are selected for the particular process recipe. More particular, the present cluster tool uses an alternative novel arrangement of chambers including the PIII chamber 712, the CCP chamber 722, the plasma treatment chamber 724, and the bonding chamber 726, which can be used in combination to form, for example, an SOI wafer, as well as other substrates and integrated circuits. Cluster tool 800 also includes the input/output chamber 728, which is used for loading an in-process wafer, and unloading a processed wafer, which is centrally located on the opposite side of the other chambers. Additional chambers 732 and 803 can perform a variety of processes such as thermal treatment, CVD, PVD, plasma or reactive ion etching, and others. Of course, the exact configuration of chambers used in the present cluster tool depends upon the application.

CCP chamber 722 is an assembly where a controlled cleaving process occurs. The CCP process separates a film of material from a bulk substrate in a controlled manner. That is, energy used to detach or separate the film is not excessive, thereby forming a substantially smooth and uniform detached film. This process occurs in an assembly, which can provide the energy (or stress) to detach the film of material from the bulk substrate.

Figure 9:
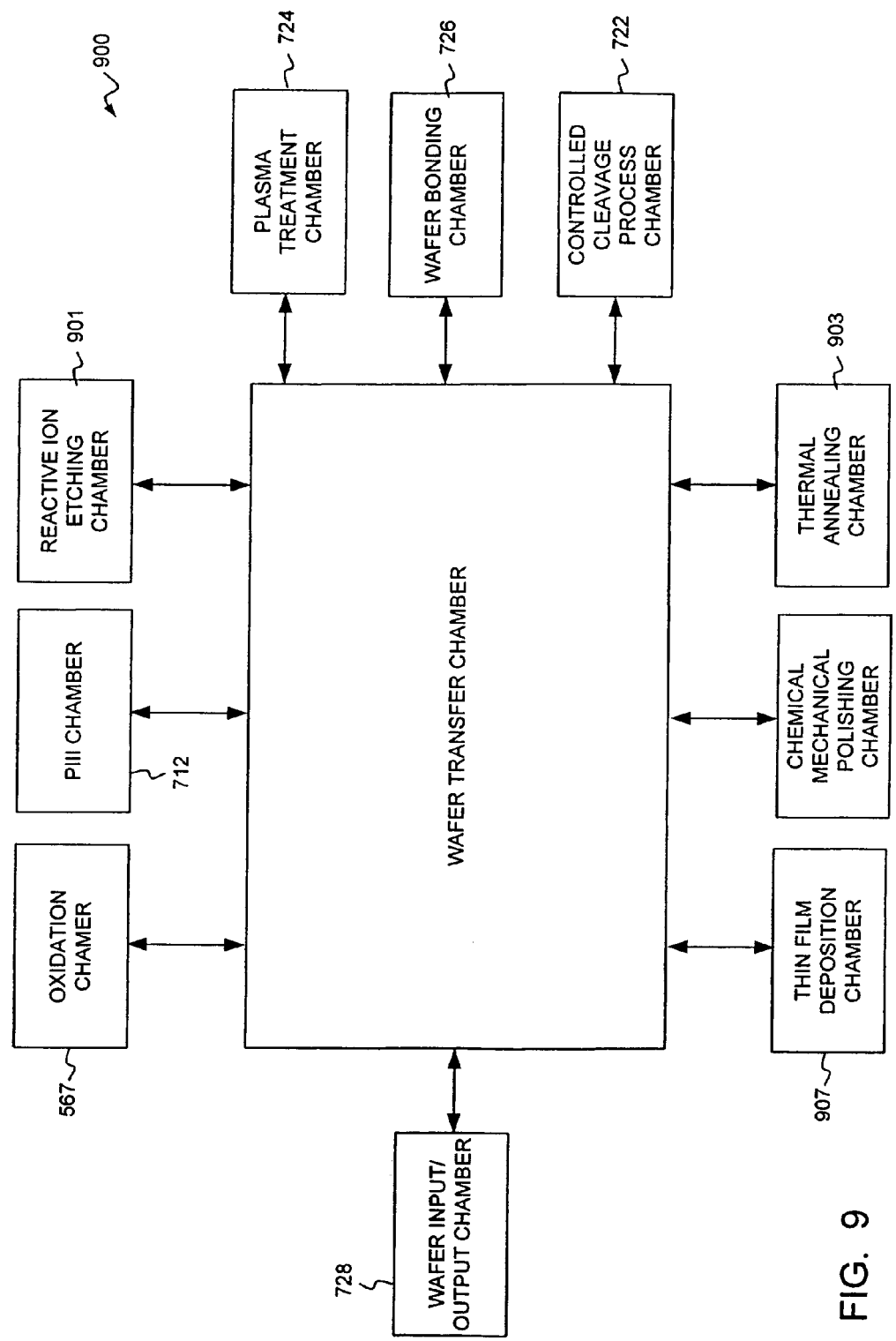

FIG. 9 is a simplified diagram of a cluster tool 900 using source switching for in-situ bonding according to still an alternative embodiment of the present invention. This diagram is merely an illustration and should not limit the scope of the claims herein. One of ordinary skill in the art would recognize other variations, modifications, and alternatives. The cluster tool 900 is made to manufacture an SOI wafer, for example. For cross-referencing purposes, some of the reference numerals in the previous figures are similar to those shown in FIG. 9. The cluster tool 900 is configured in a round or circular arrangement, but can also be in an in-line or linear configuration.

In this present embodiment, the chambers are selected for the particular process recipe to form, for example, an SOI wafer. More particularly, the present cluster tool uses the PIII chamber 712, the CCP chamber 722, the plasma treatment chamber 724, and the bonding chamber 726. Cluster tool 900 also includes the input/output chamber 728, which is used for loading an in-process wafer, and unloading a processed wafer. Additional chambers including chambers for thermal treatment 903, CVD or PVD 907, plasma or reactive ion etching 901, and others.

Each of the cluster tools is coupled to power sources, vacuum pumps, and chemical sources for the desired application. In preferred embodiments, the vacuum pumps are used to place the entire cluster tool, including chambers, in a vacuum. A power source is used to provide an RF potential for supplying energy to a plasma. Each cluster tool also includes a main control panel, which is used to control and program recipes. More particularly, a recipe is placed in memory and is controlled using micro-processor-type computer architecture. A variety of recipes in the form of computer software or programs can be stored and used according to the present invention. These and other features are will be described throughout the present specification, and more particularly below.

Although the above cluster tool is shown using a certain number of chambers and types of chambers, it is possible to use any number of chambers and even different types, if desired. For example, the number of chambers can be reduced to six or less, and even four or less. Additionally, chambers for CVD, PVD, and etching may not be used, depending upon the application. Depending upon the process, it may be desirable to only include the plasma treatment chamber and the bonding chamber, for example. Of course, the type of chambers used and their configuration will depend upon the application.

In a preferred embodiment, the above sequence of steps as illustrated in FIGS. 4 and 6 may occur in at least two chambers of a clustertool, such as the ones described above but can be others. The clustertool is generally coupled to a controller. The controller includes a variety of elements such as a microprocessor based unit, a hard disk memory storage unit, input/output elements, hard wiring, and other elements. The controller also includes a display such as a flat panel display, cathode ray tube ("CRT"), and the like. The display has a graphical user interface that includes a menu. The menu or menus can correspond to a variety of process recipes that are stored on the hard drive or other memory device. The process recipes can be in the form of a computer program or programs that use computer codes in the form of software. The computer codes carryout the functionality described herein as well as others. Alternatively, the display may have a command line interface, and command or commands can correspond to a variety of process recipes.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for in-situ plasma treatment of substrates, the method comprising:
   positioning a first face of a first substrate to face a second face of a second substrate;
   maintaining a predetermined gap between the first face and the second face;
   initiating a plasma within the predetermined gap using a first bias characterized by a first frequency, the first bias being applied to the first substrate while the second substrate is maintained at a first potential;
   maintaining the plasma within a vicinity of the first face and the second face to initiate a plasma treatment on either or both the first face and the second face; and
   switching the first bias on the first substrate to the second substrate while the first substrate is switched to a second potential.

2. The method of claim 1 wherein the first and second potentials are the same.

3. The method of claim 1 wherein the first potential is a ground potential.

4. The method of claim 1 wherein the second potential is a ground potential.

5. The method of claim 1 wherein the first potential is characterized by a second frequency.

6. The method of claim 5 wherein the second frequency is less than the cyclotron frequency of ions of the plasma.

7. The method of claim 1 wherein the second potential is characterized by a second frequency.

8. The method of claim 1 wherein the first potential and second potential are respectively characterized by a second frequency and third frequency.

9. The method of claim 1 wherein the switching coincides with a level of the first bias being about a level of the first potential.

10. The method of claim 9 wherein the level of the first bias and the level of the first potential are at a ground voltage level.

11. The method of claim 1 wherein the first substrate and the second substrate comprising at least one of silicon wafers, germanium wafers, Group III/V materials wafers, and glass wafers.

12. The method of claim 1 further comprising switching the first bias on the second substrate to the first substrate while the second substrate is maintained at a first potential.

13. The method of claim 1 wherein the first face is substantially planar and the second face is substantially planar.

14. The method of claim 1 wherein the predetermined gap ranges from about 1 mm to about 20 mm.

15. The method of claim 1 wherein the predetermined gap is less than 3 cm.

16. The method of claim 1 wherein further comprising maintaining a pressure in a range of about 0.01 Torr to about 0.7 Torr.

17. The method of claim 1 wherein further comprising maintaining a pressure in a range of about 0.02 Torr to about 0.5 Torr.

18. The method of claim 1 wherein the plasma comprises a species of at least one of argon (Ar), oxygen (O2), hydrogen (H2), helium (He), nitrogen (N2), air without water (H2O) vapor, and combinations thereof.

19. The method of claim 1 wherein the vicinity is located on and in contact with the first face.

20. The method of claim 1 wherein the first frequency at least the cyclotron frequency of ions of the plasma.

21. The method of claim 1 wherein a major portion of the first face is parallel to a major portion of the second face.

* * * * *